(12) United States Patent
Wang et al.

(10) Patent No.: US 12,035,556 B2
(45) Date of Patent: Jul. 9, 2024

(54) DISPLAY DEVICE AND METHOD FOR MANUFACTURING THE SAME

(71) Applicants: Chengdu BOE Optoelectronics Technology Co., Ltd., Sichuan (CN); BOE Technology Group Co., Ltd., Beijing (CN)

(72) Inventors: Xinpeng Wang, Beijing (CN); Xiaolong Zhu, Beijing (CN); Hengzhen Liang, Beijing (CN); Fan Li, Beijing (CN); Wenxiao Niu, Beijing (CN); Hao Huang, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 705 days.

(21) Appl. No.: 17/260,007

(22) PCT Filed: Mar. 20, 2020

(86) PCT No.: PCT/CN2020/080320
§ 371 (c)(1),
(2) Date: Jan. 13, 2021

(87) PCT Pub. No.: WO2021/184331
PCT Pub. Date: Sep. 23, 2021

(65) Prior Publication Data
US 2022/0115621 A1   Apr. 14, 2022

(51) Int. Cl.
*H10K 50/84*   (2023.01)
*H10K 59/12*   (2023.01)
(Continued)

(52) U.S. Cl.
CPC ........... *H10K 50/841* (2023.02); *H10K 59/40* (2023.02); *H10K 71/00* (2023.02); *H10K 71/80* (2023.02);
(Continued)

(58) Field of Classification Search
CPC .............. H04M 1/0269; H04M 1/0268; H10K 2102/311; H10K 50/84; H10K 50/841;
(Continued)

(56) References Cited

U.S. PATENT DOCUMENTS 10,326,100 B2   6/2019   Hirakata et al.
11,963,425 B1 *  4/2024   Wittenberg .......... H10K 50/854
(Continued)

FOREIGN PATENT DOCUMENTS

CN      106371513 A    2/2017
CN      108279737 A    7/2018
(Continued)

OTHER PUBLICATIONS

First Office Action dated Oct. 27, 2022 corresponding to Indian application No. 202147051199.
(Continued)

*Primary Examiner* — Ali Naraghi
*Assistant Examiner* — E. Rhett Cheek
(74) *Attorney, Agent, or Firm* — Nath, Goldberg & Meyer; Joshua B. Goldberg

(57) ABSTRACT

There is provided a display device including a cover plate and a display panel; the cover plate includes a middle plane part, a first edge curved surface part, a second edge covered surface part and a corner curved surface part; the display panel includes a middle part, an edge part and a corner part; the middle part is arranged corresponding to the middle plane part; the edge part includes a first edge part and a second edge part; the first edge part and the first edge curved
(Continued)

surface part are arranged correspondingly, and the second edge part and the second edge curved surface part are arranged correspondingly; the corner part and the corner curved surface part are correspondingly arranged; the middle part is in a display area; at least a portion of the edge part and the corner part adjacent to the middle part is in the display area.

17 Claims, 11 Drawing Sheets

(51) Int. Cl.
  *H10K 59/40* (2023.01)
  *H10K 71/00* (2023.01)
  *H10K 71/80* (2023.01)
  *H10K 77/10* (2023.01)
  *H10K 102/00* (2023.01)

(52) U.S. Cl.
  CPC ........ *H10K 77/111* (2023.02); *H10K 59/1201* (2023.02); *H10K 2102/311* (2023.02)

(58) Field of Classification Search
  CPC .. H10K 50/842; H10K 59/871; H10K 59/872; H10K 77/111; H10K 59/40
  See application file for complete search history.

(56) References Cited

U.S. PATENT DOCUMENTS

| | | | |
|---|---|---|---|
| 2014/0132488 A1 | 5/2014 | Kim et al. | |
| 2014/0197380 A1 | 7/2014 | Sung et al. | |
| 2016/0062391 A1* | 3/2016 | Choi | G06F 1/1652 |
| | | | 361/679.01 |
| 2017/0069867 A1* | 3/2017 | Hirakata | H10K 50/844 |
| 2017/0098794 A1* | 4/2017 | Cho | H10K 50/80 |
| 2017/0192140 A1* | 7/2017 | Yoon | G09G 3/03 |
| 2018/0088631 A1* | 3/2018 | Park | H10K 50/844 |
| 2018/0134022 A1 | 5/2018 | Kim et al. | |
| 2018/0368270 A1* | 12/2018 | Seo | G06F 1/16 |
| 2019/0034020 A1 | 1/2019 | He et al. | |
| 2019/0343010 A1* | 11/2019 | Ji | H10K 50/84 |
| 2020/0075885 A1* | 3/2020 | Jiang | G06F 1/1652 |
| 2021/0320275 A1* | 10/2021 | Cho | G06F 1/16 |

FOREIGN PATENT DOCUMENTS

| | | | | |
|---|---|---|---|---|
| CN | 110065220 A | 7/2019 | | |
| CN | 110865740 A | 3/2020 | | |
| WO | WO-2018155930 A1 * | 8/2018 | ....... | G02F 1/133308 |

OTHER PUBLICATIONS

Notification of Grant dated Feb. 7, 2024 corresponding to European application No. 20897631.6-1211.
First Office Action dated Jan. 29, 2024 corresponding to Japanese application No. 2021-571723.

* cited by examiner

DISPLAY DEVICE AND METHOD FOR MANUFACTURING THE SAME

This is a National Phase Application filed under 35 U.S.C. 371 as a national stage of PCT/CN2020/080320, filed Mar. 20, 2020, the content of which is hereby incorporated by reference in its entirety.

TECHNICAL FIELD

Embodiments of the present disclosure relate to the field of display technology, and in particular to a display device and a method for manufacturing the display device.

BACKGROUND

Compared with LCDs (liquid crystal displays), Organic Light Emitting Diode (OLED) displays, especially flexible OLED displays, each have advantages of being lighter, thinner, higher in brightness, lower in power consumption, faster in response, higher in definition, better in flexibility and higher in light emitting efficiency, can meet new requirements of consumers on novel display technologies, and are popular more and more among consumers.

The flexible OLED displays can achieve bending, folding, and edge bending, which are desirable designs of displays. Currently, there is a certain technical difficulty in achieving high yield and high reliability of bending, folding, and edge bending due to limitations of materials, processes, and the like.

The above information disclosed in this background is only for enhancing understanding of background of the present disclosure and therefore it may contain information that does not form any part of the related art nor that it may suggest itself to a person of ordinary skill in the art.

SUMMARY

Embodiments of the present disclosure provide a display device and a method for manufacturing the display device.

In a first aspect, an embodiment of the present disclosure provides a display device, including a cover plate and a display panel, where the display panel is arranged on the cover plate, and a shape of the display panel matches with that of the cover plate;

the cover plate includes a middle plane part, an edge curved surface part and a corner curved surface part;

the middle plane part is provided with two first side edges opposite to each other, two second side edges opposite to each other and four corners positioned between the first side edges and the second side edges;

the edge curved surface part includes two first edge curved surface parts and two second edge curved surface parts; the two first edge curved surface parts are respectively adjacent to the two first edges, and the two second edge curved surface parts are respectively adjacent to the two second edges;

shapes of the two first edge curved surface parts are different; shapes of the two second edge curved surface parts are the same;

a surface parallel to a surface of the middle plane part is a reference surface; a distance between orthographic projections of an edge, adjacent to the middle plane part, and an edge, away from the middle plane part, of each curved surface part on the reference surface is a width of the edge curved surface part;

widths of the two first edge curved surface parts are different, and a ratio of a smaller width to a larger width is between 0.65 and 0.85;

the corner curved surface part is adjacent to a corner of the middle plane part and is positioned between the first edge curved surface part and the second edge curved surface part;

the display panel includes a middle part, an edge part and a corner part; the middle part is arranged corresponding to the middle plane part; the edge part includes a first edge part and a second edge part; the first edge part and the first edge curved surface part are arranged correspondingly, and the second edge part and the second edge curved surface part are arranged correspondingly; the corner part and the corner curved surface part are arranged correspondingly;

the display panel includes a display area; the middle part is the display area; at least a portion, adjacent to the middle part, of the edge part and the corner part is the display area.

In some implementations, a distance between orthographic projections of edges of the two first edge curved surface parts away from the middle plane part on the reference surface is between 150 mm and 170 mm;

a distance between orthographic projections of edges of the two second edge curved surface parts away from the middle plane part on the reference surface is between 65 mm and 80 mm.

In some implementations, a distance between the two first side edges is between 140 mm and 160 mm;

a distance between the two second side edges is between 60 mm and 70 mm.

In some implementations, widths of the two first edge curved surface parts are respectively between 2 mm and 4 mm, and between 3 mm and 6 mm;

a width of the second edge curved surface part is between 3 mm and 4 mm.

In some implementations, a distance between orthographic projections of an edge of the display area in each edge part and an edge of the edge part adjacent to the middle part on the reference plane is a display width of the edge part;

display widths of the two first edge parts are different and are respectively between 0.5 mm and 1 mm and between 0.3 mm and 0.8 mm;

display widths of the two second edge parts are the same and range from 1.5 mm to 2.5 mm.

In some implementations, the edge part and the corner part each have a non-display area located on a side of the display area away from the middle part.

In some implementations, touch structures are disposed in the middle part, the edge part, and the corner part of the display panel.

In some implementations, a cross section perpendicular to the first side edge is a first cross section and a cross section perpendicular to the second side edge is a second cross section;

for first cross sections at different positions along a length direction of the first side edge, shapes of first edge curved surface parts are the same;

for second cross sections at different positions along a length direction of the second side edge, shapes of second edge curved surface parts are the same.

In some implementations, an orthographic projection of the cover plate on the reference plane is an arc-angle rectangle;

an orthographic projection of the middle plane part on the reference plane is an arc-angle rectangle;

an orthographic projection of the display panel on the reference surface is an arc-angle rectangle;

an orthographic projection of the display area on the reference surface is an arc-angle rectangle.

In some implementations, a cross section perpendicular to the first side edge is a first cross section and a cross section perpendicular to the second side edge is a second cross section;

for first cross sections, along a direction gradually away from the first edge part, from the first cross section passing through a boundary between the first edge part and the corner part, an included angle between a surface of the corner part at a position farthest away from the middle part and the reference plane is gradually reduced from a first angle;

for second cross sections, along a direction gradually away from the second edge part, from the second cross section passing through a boundary between the second edge part and the corner part, an included angle between a surface of the corner part at a position farthest from the middle part and the reference plane is gradually decreased from a second angle.

In some implementations, the first angle is between 30 degrees and 60 degrees;

the second angle is between 50 degrees and 75 degrees;

the first angle is less than the second angle.

In some implementations, in the reference plane, an orthographic projection of each corner part away from an edge of the middle part is a convex arc shape, the convex arc shape having two end points, where the end point coupled to an orthographic projection of the first edge part is a first end point, and the end point coupled to an orthographic projection of the second edge part is a second end point;

a line passing through the first end point and parallel to the orthographic projection of the second side edge and a line passing through the second end point and parallel to the orthographic projection of the first side edge have an intersection point and form an included angle, the intersection point is a positioning point of the corner part, and the included angle is a positioning angle of the corner part;

for any point on the convex arc shape, a section passing through the point and the positioning point and vertical to the reference surface is a third cross section of the point, and in the third cross section, an included angle between a surface of the corner part at a position farthest away from the middle part and the reference surface is a comprehensive included angle of the point;

in a direction from the first end point to the second end point, comprehensive included angles corresponding to points of the convex arc shape are gradually reduced from the first angle to a third angle and then gradually increased to the second angle.

In some implementations, the comprehensive included angle on the convex arc shape is a coupling line between a point of the third angle and the positioning point, and is an angle bisector of the positioning angle.

In some implementations, the third angle is between 1 degree and 5 degrees.

In some implementations, the display device further includes:

a binding part arranged on a side, away from the cover plate, of the display panel;

a bending part coupled between the binding part and an edge of the display panel, which is the edge of the display panel corresponding to the first edge curved surface part with the larger width;

a bending spacer provided between the display panel and the binding part, and having a first surface bonded to the display panel and a second surface bonded to the binding part;

the second surface includes a convex arc surface area and a plane area which are coupled;

an orthographic projection of the plane area on the reference surface is positioned in an orthographic projection of the middle plane part on the reference surface;

a portion of orthographic projection of the convex arc surface area on the reference surface is positioned in the orthographic projection of the middle plane part on the reference surface, and another portion of orthographic projection of the convex arc surface area on the reference surface is in an orthographic projection of the first edge curved surface part with the larger width on the reference surface.

In some implementations, a curvature radius of the bending part is equal to a limit curvature radius, and the limit curvature radius is a minimum curvature radius of the bending part without damage from bending;

a distance between an orthographic projection of an edge of the convex arc surface area, coupling to the plane area on the reference surface, and an orthographic projection of the first side edge adjacent to the first edge curved surface part with the larger width on the reference surface is between 1.5 mm and 2.5 mm.

In a second aspect, an embodiment of the present disclosure provides a method for manufacturing the display device described above, including:

disposing a planar, flexible display panel between a mold and a cover plate;

relatively approaching the mold and the cover plate to extrude the display panel so that the display panel forms a shape matched with the cover plate.

In some implementations, the method further includes: before disposing the planar, flexible display panel between the mold and the cover plate, attaching the planar, flexible display panel to a flexible carrier film to pre-deform the carrier film and the display panel on the carrier film;

after relatively approaching the mold and the cover plate to extrude the display panel, separating the carrier film from the display panel.

In a case where an absolute size of the edge area is constant, compared with a case where the edge area is a plane, when an edge curved surface part (edge area in a curved surface mode) is used, the size of the edge area (or the size of orthographic projection of the edge area on the reference surface) that can be "seen" by the user is reduced, that is, the edge area in the curved surface mode is advantageous for narrowing a bezel.

Since each edge area of the display device in the embodiment of the present disclosure is a curved surface, and thus the bezel of each side of the display device can be relatively narrow, a narrow bezel design is favorably realized, and a screen occupation ratio is improved.

Meanwhile, widths of edge curved surface parts at different sides of the display device in the embodiment of the present disclosure are different, and the widths conform to a specific proportional relation, and thus a best design can be realized.

DESCRIPTION OF DRAWINGS

The accompanying drawings are included to provide a further understanding of embodiments of the present disclosure, constitute a part of the specification, are used for explaining principles of the present disclosure together with the embodiments of the present disclosure, but do not limit the present disclosure. The above and other features and advantages will become more apparent to those skilled in the art by describing in detail exemplary embodiments with reference to the accompanying drawings, in which.

Figure 1:
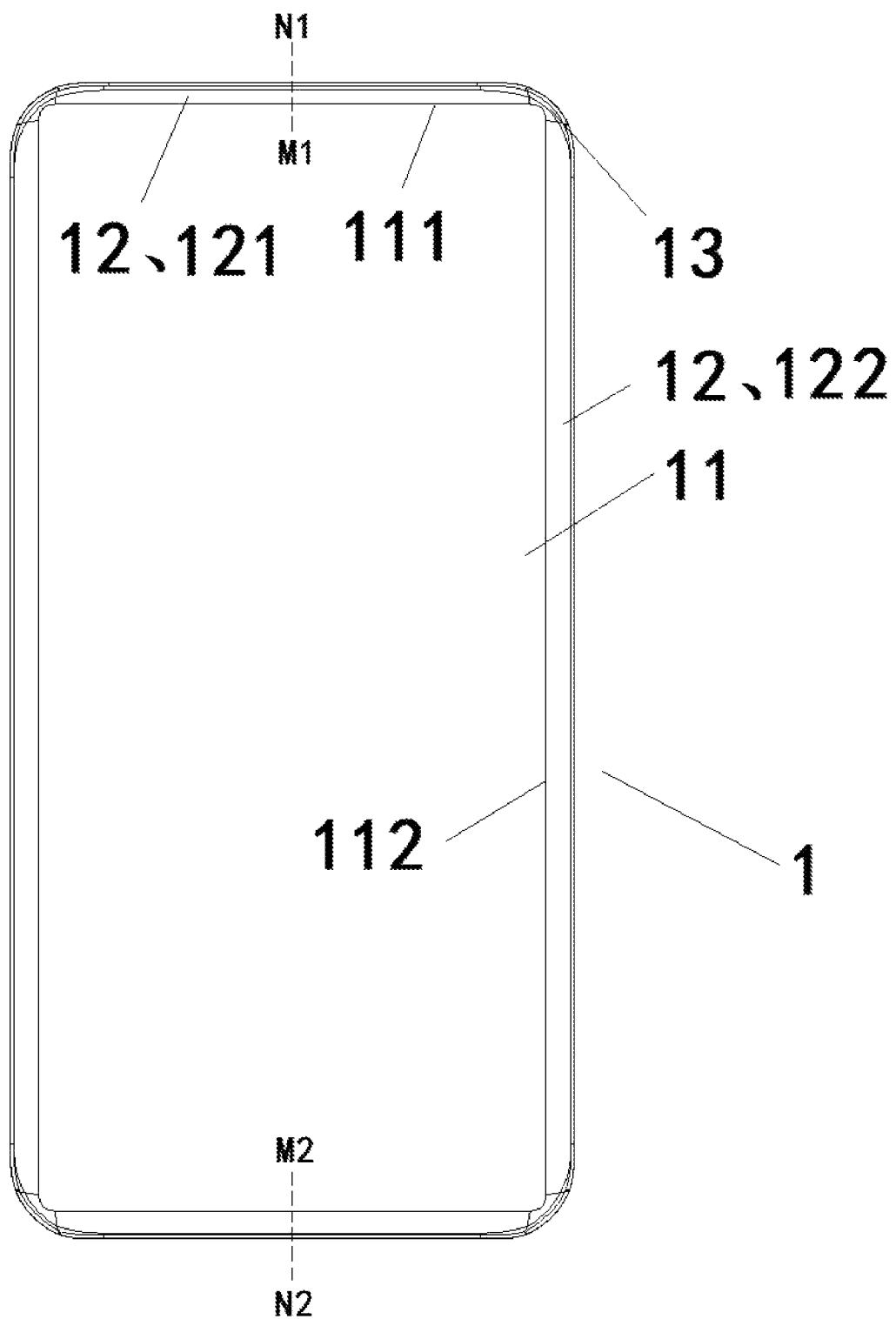
FIG. 1 is a schematic front view of a display device according to an embodiment of the present disclosure.

1. cover plate; 11. middle plane part; 111. first side edge; 112. second side edge; 12. edge curved surface part; 121. first edge curved surface part; 122. second curved surface part; 13. corner curved surface part; 2. display panel; 21. middle part; 22. edge part; 221. first edge part; 222. second edge part; 23. corner part; 291. display layer; 292. polarizing layer; 293. first adhesive layer; 294. touch layer; 295. second adhesive layer; 296. back film layer; 297. heat dissipation layer; 299. third adhesive layer; 3. bending spacer; 31. first surface; 32. second surface; 321. convex arc surface area; 322. plane area; 39. double-sided adhesive; 41. binding part; 421. protective adhesive layer; 42. bending part; 5. carrier film; 6. mold.

DESCRIPTION OF EMBODIMENTS

In order to enable those skilled in the art to better understand technical solutions of embodiments of the present disclosure, the following detailed description is provided for a display device according to the embodiments of the present disclosure with reference to the accompanying drawings.

The embodiments of the present disclosure will be described more fully hereinafter with reference to the accompanying drawings, but the embodiments shown may be embodied in different forms and should not be construed as limited to the embodiments set forth herein. Rather, these embodiments are provided so that the present disclosure will be thorough and complete, and will fully convey the scope of the present disclosure to those skilled in the art.

The embodiments of the present disclosure may be described with reference to plan and/or cross sectional views by way of idealized schematic illustrations of the present disclosure. Accordingly, the example illustrations may be modified in accordance with manufacturing techniques and/or tolerances.

Embodiments of the present disclosure and features of the embodiments may be combined with each other without conflict.

Terminologies used in the present disclosure are for the purpose of describing particular embodiments only and are not intended to be limiting of the present disclosure. As used in the present disclosure, the term "and/or" includes any and all combinations of one or more of associated listed items. As used in the present disclosure, the singular forms "a", "an" and "the" are intended to include the plural forms as well, unless the context clearly indicates otherwise. The terms "include" and "including" as used in the present disclosure, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used in the present disclosure have the same meaning as commonly understood by one of ordinary skill in the art. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

The embodiments of the present disclosure are not limited to the embodiments shown in the drawings, but include modifications of configurations formed based on a manufacturing process. Thus, areas illustrated in the drawings have schematic properties, and shapes of the areas shown in the drawings illustrate specific shapes of areas of elements, but are not intended to be limiting.

In a first aspect, an embodiment of the present disclosure provides a display device, which includes a cover plate 1 and a display panel 2, where the display panel 2 is disposed on the cover plate 1, and the display panel 2 is adapted to the cover plate 1 in shape.

The display device has a light-emitting side (e.g., the left side in FIGS. 4 and 5), that is, when the display device is in use, a user can see a picture displayed at the light-emitting side.

The cover plate 1 (e.g., CG, Cover Glass) is a rigid transparent plate (e.g., glass plate) having a specific shape, which corresponds to a "housing" of the display device at the light-emitting side when the display device is in use.

The display panel 2 can be configured for displaying, is flexible, and is attached to a side of the cover plate 1 away from the light-emitting side to form a shape adapt to a surface of the cover plate 1.

Specifically, the display panel 2 may be in a form of an Organic Light Emitting Diode (OLED) display panel or the like.

The display panel 2 may be formed by stacking a plurality of different layer structures. For example, referring to FIGS. 4 and 5, in a direction gradually away from the cover plate 1, the display panel 2 may sequentially include: a polarizing layer 292, a first adhesive layer 293 (MOCA), a touch layer 294 (TP Sensor), a second adhesive layer 295 (BOCA), a display layer 291, a back film layer 296 (Back film), a heat dissipation layer 297 (SCF), and the like.

The display layer 291 is configured for displaying, the polarizing layer 292 is configured for eliminating light reflection, the touch layer 294 is configured for realizing touch, the back film layer 296 plays a role of supporting the display layer 291, the heat dissipation layer 297 is configured for enhancing heat dissipation, and the adhesive layers are configured for bonding adjacent layer structures together.

The layer structures are flexible, the display panel 2 is integrally formed by the layer structures, and the display panel 2 can be bonded to the cover plate 11 through a third adhesive layer 299 (TOCA).

Certainly, it should be understood that various layer structures in the display panel 2 may be arranged in alignment, i.e., all positions of the display panel 2 may have the same layer structures.

Alternatively, it is also possible that the display panel 2 has only a portion of the layer structures at some positions, i.e., a portion of the layer structures may be located only in a partial area of the display panel 2.

In the display device of the embodiment of the present disclosure, the cover plate 1 includes a middle plane part 11, an edge curved surface part 12, and a corner curved surface part 13;

the middle plane part 11 has two first side edges 111 opposite to each other, two second side edges 112 opposite to each other, and four corners between the first side edges 111 and the second side edges 112;

the edge curved surface part 12 includes two first edge curved surface parts 121 and two second edge curved surface parts 122; the two first edge curved surface parts 121 are respectively adjacent to the two first side edges 111, and the two second edge curved surface portions 122 are respectively adjacent to the two second side edges 112;

the two first edge curved surface parts 121 are different in shape; the two second edge curved surface parts 122 have the same shape;

a surface parallel to a surface of the middle plane part 11 is a reference surface; a distance between orthographic projections of an edge, adjacent to the middle plane part 11, and an edge, away from the middle plane part 11, of each edge curved surface part 12, on the reference plane is a width of the edge curved surface part 12;

the two first edge curved surface parts 121 have different widths, and a ratio of a smaller width to a larger width is between 0.65 and 0.85;

the corner curved surface part 13 is adjacent to the corner of the middle plane part 11 and is positioned between the first edge curved surface part 121 and the second edge curved surface part 122;

the display panel 2 includes a middle part 21, an edge part 22, and a corner part 23; the middle part 21 is arranged corresponding to the middle plane part 11; the edge part 22 includes a first edge part 221 and a second edge part 222; the first edge part 221 is provided corresponding to the first edge curved surface part 121, and the second edge part 222 is provided corresponding to the second edge curved surface part 122; the corner part 23 is arranged corresponding to the corner curved surface part 13;

the display panel 2 includes a display area; the middle part 21 is located in the display area; at least a portion, adjacent to the middle part 21, of the edge part 22 and the corner part 23 is located in the display area.

Referring to FIG. 1, the cover plate 1 according to the embodiment of the present disclosure includes a middle plane part 11 located in a middle area, where the middle plane part 11 is a flat plate, and two side surfaces of the middle plane part 11 are parallel to each other; the middle plane part 11 has two sets of side edges (first side edges 111 and second side edges 112), each set of side edges are disposed opposite to each other, and the side edges are coupled by corners; the edge curved surface part 12 (first edge curved surface parts 121, second edge curved surface parts 122) is located outside the side edges of the middle plane part 11, the corner curved surface part 13 is outside the corners, and the edge curved surface parts 12 and the corner curved surface part 13 each have a curved surface, more specifically, a curved surface (arc surface) bending in a direction away from the light-emitting side of the display device.

Thus, the cover plate 1 entirely has the middle part 21 being flat and a curved edge area bending in a direction away from the light-emitting side of the display device.

Figure 2:
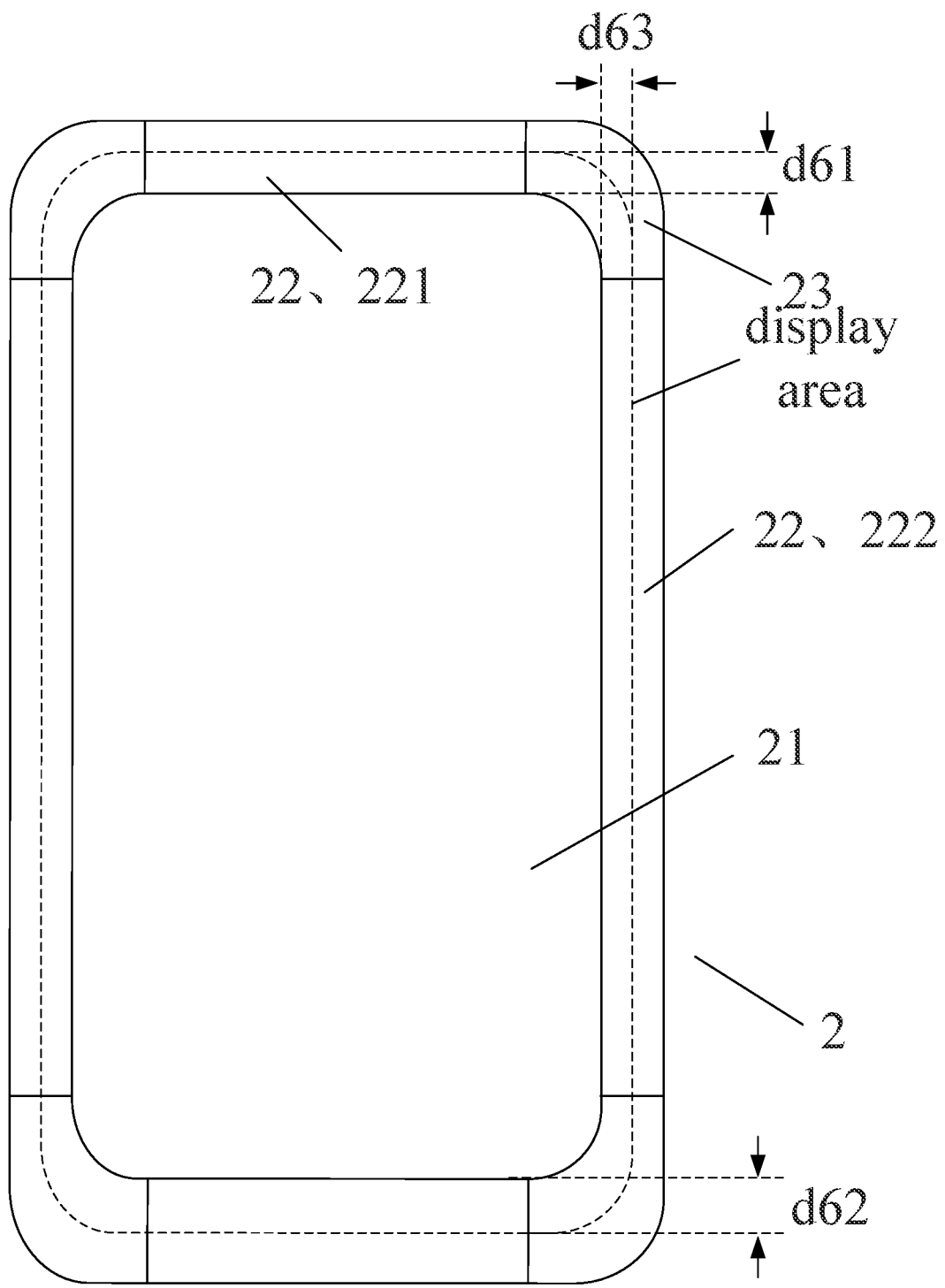
FIG. 2 is a schematic structural diagram of a display panel in a display device according to an embodiment of the present disclosure.

Corresponding to the cover plate 1, referring to FIG. 2, the display panel 2 has a middle part 21, an edge part 22, and a corner part 23.

Figure 3:
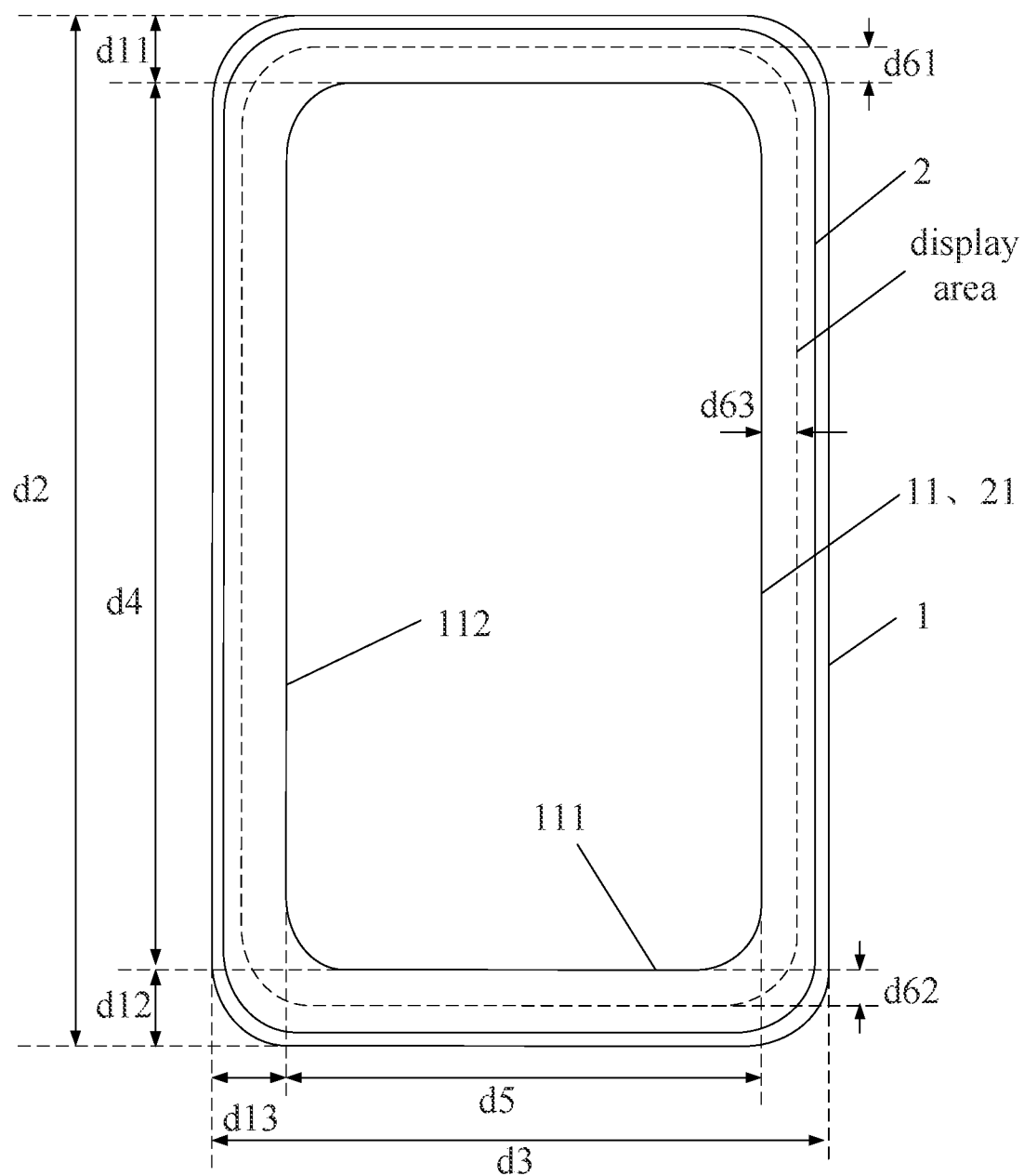
FIG. 3 is a schematic diagram illustrating a comparison between positions of a display panel and a cover plate in a display device according to an embodiment of the present disclosure.

The middle part 21 is a plane because it corresponds to the middle plane part 11, and referring to FIG. 3, a shape (frame size) and a position of the middle part 21 are the same as those of the middle plane part 11.

The edge part 22 and the corner part 23 correspond to the edge curved surface part 12 and the corner curved surface part 13, respectively, and thus they are formed to have curved surfaces (arc surfaces). However, referring to FIG. 3, the edge part 22 and the corner part 23 of the display panel 2 may be located only in partial areas of the edge curved surface part 12 and the corner curved surface part 13 of the cover plate 1, i.e., the edge part 22 and the corner part 23 may be "narrower" than the edge curved surface part 12 and the corner curved surface part 13.

Referring to FIGS. 2 and 3, at least a partial area of the display panel 2 is a display area capable of displaying. Specifically, the middle part 21 is the display area; at least an area of the edge part 22 and the corner part 23 near the middle part 21 is also the display area.

That is, the middle area of the display device can realize a flat display, and at least a portion of the edge area surrounding the middle area can realize a curved display, so as to improve the display effect.

It should be understood that an area without the display panel 2 cannot display, and thus the display area does not extend beyond the display panel 2; meanwhile, the display panel 2 necessarily has the display layer 291 described above at a position corresponding to the display area, so as to achieve the display effect.

However, it is not necessary that the display panel 2 is entirely the display area, and a position of the display panel 2 having the display layer 291 is not necessarily the display area. For example, the display layer 291 may be present at all positions of the display panel 2, but the display layer 291 at an edge of the display panel 2 cannot realize display, and the display layer 291 at the edge of the display panel 2 may be used to arrange edge wires and the like.

For convenience of description, a plane parallel to a surface of the middle plane part 11 of the cover plate 1 (either side surface, since both side surfaces of the middle plane part 11 are parallel to each other) is defined as a reference plane.

Thus, referring to FIG. 3, a certain distance (d11, d12, d13) exists between orthographic projections of two edges, proximal to the middle plane part 11 and away from the middle plane part 11 respectively, of each edge curved surface part 12 of the cover plate on the reference plane, and the distance is a "width" of the edge curved surface part 12.

It should be understood that the width of the edge curved surface part 12 defined above is a width of projected pattern of the edge curved surface part 12 on the reference plane, that is, a width of the edge curved surface part 12 "seen" from the light-emitting side when a user uses the display device, and such width is obviously smaller than an absolute size of the edge curved surface part 12 along the curved surface direction, and thus it is advantageous to realize a narrow bezel design of the display device.

In the embodiment of the present disclosure, the two second edge curved surface parts 122 have a same shape (or are symmetrically distributed), and thus widths d13 of the two second edge curved surface parts 122 are also the same.

The two first edge curved surface parts 121 are different in shape and different in width. A ratio of the width d11 of the first edge curved surface part 121 being smaller to the width d12 of the first edge curved surface part 121 being larger is between 0.65 and 0.85, and further between 0.7 and 0.8.

The two second edge curved surface parts 122 are generally left and right sides of the display device in use, the two first edge curved surface parts 121 are generally upper and lower sides of the display device in use, and the first edge curved surface part 121 with a larger width is generally the lower side of the display device in use.

Thus, the curved surface of the edge area of the display device according to the embodiment of the present disclosure is left-right symmetrical, but is not symmetrical in a vertical direction from top to bottom, and is generally in a form of "narrow top and wide bottom".

Obviously, in a case where an absolute size of the edge area is constant, compared with a case where the edge area is a plane, when an edge curved surface part (edge area in a curved surface mode) is used, the size of the edge area (or the size of orthographic projection of the edge area on the reference surface) that can be "seen" by the user is reduced, that is, the edge area in the curved surface mode is advantageous for narrowing a bezel.

Since each edge area of the display device of the embodiment of the present disclosure is a curved surface, the bezel on each side of the display device can be narrower, a narrow bezel design is favorably realized, and a screen occupation ratio is improved.

Meanwhile, widths of the edge curved surface parts 12 on different sides of the display device of the embodiment of the present disclosure are different, and the widths conform to a specific proportional relationship, and thus a best design can be achieved.

In some implementations, a distance between orthographic projections of edges of the two first edge curved surface parts 121 away from the middle plane part 11 on the reference plane is between 150 mm and 170 mm;

a distance between orthographic projections of edges of the two second edge curved surface parts 122 away from the middle plane part 11 on the reference surface is between 65 mm and 80 mm.

Referring to FIG. 3, a distance d2 between orthographic projections of edges, farthest to each other, of the two first edge curved surface parts 121 on the reference plane corresponds to a "total length" of the display device, and the total length d2 is between 150 mm and 170 mm, further between 155 mm and 160 mm, and still further 157.15 mm. In contrast, a distance d3 between orthographic projections of edges, farthest to each other, of the two second edge curved surface parts 122 on the reference plane corresponds to a "total width" of the display device, and the total width d3 is between 65 mm and 80 mm, further between 70 mm and 75 mm, and still further 71.95 mm.

In some implementations, a distance between the two first side edges 111 ranges from 140 mm to 160 mm; a distance between the two second side edges 112 ranges from 60 mm to 70 mm.

Referring to FIG. 3, a distance d4 between the two first side edges 111 of the middle plane part 11 and a distance d5 between the two second side edges 112 of the middle plane part 11 correspond to a length and a width of a "flat display area" in the middle of the display device, respectively. Specifically, the length d4 of the flat display area is between 140 mm and 160 mm, further between 145 mm and 155 mm, and still further 150.72 mm; and the width d5 of the flat display area is between 60 mm and 70 mm, further between 62 mm and 65 mm, and still further 64.6 mm.

In some implementations, widths of the two first edge curved parts 121 are between 2 mm and 4 mm, and between 3 mm and 6 mm, respectively; the width of the second edge curved surface part 122 is between 3 mm and 4 mm.

Referring to FIG. 3, a ratio of the widths of the two first edge curved surface parts 121 should satisfy the above relationship. Specifically, the width d11 of the first edge curved surface part 121 being smaller is between 2 mm and 4 mm, and is further 2.83 mm; the width d12 of the first edge curved surface part 121 being larger is between 3 mm and 6 mm, and is further 3.599 mm. The width d13 of each of the two second edge curved surface parts 122 is between 3 mm and 4 mm, and is further 3.677 mm.

In some implementations, a distance between orthographic projections of an edge of the display area in each edge part 22 and an edge of the edge part 22 adjacent to the middle part 21 on the reference plane is a display width of the edge part 22;

the two first edge parts 221 have different display widths, which are respectively between 0.5 mm and 1 mm and between 0.3 mm and 0.8 mm;

the two second edge parts 222 have a same display width, which is between 1.5 mm and 2.5 mm.

Referring to FIG. 3, the display area inevitably enters the edge part 22 and the corner part 23 of the display panel, that is, enters the edge curved surface part 12 and the corner curved surface part 13 of the cover plate 11, and thus the distance between orthographic projections of the edge of the display area and the edge of the edge part 22 proximal to the middle part 21 (that is, the first side edge 111 or the second side edge 112 of the middle plane part 11) on the reference plane is the width of the display area in the edge curved surface part 12 that can be "seen" by the user at the light-emitting side, that is, the "display width (d61, d62, d63)" of the edge part 22.

Specifically, referring to FIG. 3, the two first edge parts 221 have different display widths, and the display width d61 of the first edge part 221 corresponding to the first edge curved surface part 121 being smaller may be between 0.5 mm and 1 mm (or the width of the display area in the first edge curved surface part 121 being smaller is between 0.5 mm and 1 mm), and is further 0.7665 mm; the display width d62 of the first edge part 221 corresponding to the first edge curved surface part 121 being larger may be between 0.3 mm and 0.8 mm (or the width of a portion of the display area in the first edge curved surface part 121 being larger is between 0.3 mm and 0.8 mm), and is further 0.5676 mm.

Display widths d63 of the two second edge parts 222 may be the same, specifically, between 1.5 mm and 2.5 mm (or the width of a portion of the display area in the second edge curved surface part 122 is between 1.5 mm and 2.5 mm), and is further 2.0816 mm.

It can be seen that the above display widths each are smaller than the width of the edge curved surface part 12 corresponding thereto, that is, a portion of the edge curved surface part 12 proximal to the middle plane part 11 can realize display, and a portion of the edge curved surface part 12 away from the middle plane part 11 does not perform display (may not correspond to the display panel, or correspond to a non-display area of the display panel 2) because the curved surface thereof is too inclined.

In some implementations, both the edge part 22 and the corner part 23 have a non-display area located on a side of the display area away from the middle part 21.

Referring to FIG. 3, for reasons of processes, the display panel 2 may further include a non-display area, which cannot display, surrounding the display area capable of displaying, and for example, the non-display area may be used for disposing edge wires and the like. In the embodiment of the present disclosure, since the middle part 21 of the display panel 2 is entirely the display area, and areas of the edge part 22 and the corner part 23 near the middle part 21 are also the display area, the non-display area is necessarily located outside the display area of the edge part 22 and the corner part 23.

An edge of the non-display area away from the middle part 21 is an edge of the display panel 2, which cannot exceed the edge of the cover plate 1, and cannot be smaller than the edge of the middle plane part 11, that is, an orthographic projection of the edge of the display panel 2 on the reference plane is inevitably located in the orthographic projections of the edge curved surface part 12 and the corner curved surface part 13 on the reference plane, and is maximally coincident with the orthographic projection of the edge of the cover plate 1 on the reference plane, that is, the display panel 2 can maximally "full fill" the cover plate 1.

Thus, referring to FIG. 3, in an outward direction from a center of the display device, the edge of the middle plane part 11 (i.e., the middle part 21), the edge of the display area, the edge of the display panel 2, and the edge of the cover plate 1 should be sequentially passed; the edge of the display panel 2 and the edge of the cover plate 1 may coincide.

Since the non-display area of the display panel 2 cannot realize display, the size of the non-display area should be as small as possible. For example, in the first edge curved surface part 121 being smaller, a width of the non-display area of the display panel 2 (i.e., the distance between orthographic projections of the edge of the display panel 2 and the edge of the display area on the reference plane) may be 0.8835 mm; in the first edge curved surface part 121 being larger, the width of the non-display area of the display panel 2 may be 1.3726 mm. In the two second edge curved surface parts 122, widths of non-display areas of the display panel 2 may be the same, and each may be 0.5782 mm.

The bezel of the display device refers to an area from the edge of the display area to the edge of the display device (cover plate 1), and the area includes the non-display area in the display panel 2, and may also include an area not covered by the display panel 2 in the edge curved surface part 12 and the corner curved surface part 13 of the cover plate 1. Obviously, the bezel should also be as narrow as possible. For example, in the first edge curved surface part 121 being smaller, a width of the bezel (i.e., the distance between orthographic projections of the edge of the display area and the edge of the cover plate 1 on the reference plane) may be 2.0635 mm, and in the first edge curved surface part 121 being larger, a width of the bezel may be 3.0314 mm. In the two second edge curved surface parts 122, widths of non-display areas of the display panel 2 may be the same, and each may be 1.5954 mm.

The specific size of the non-display area (e.g., the width of the non-display area) is not limited.

Figure 4:
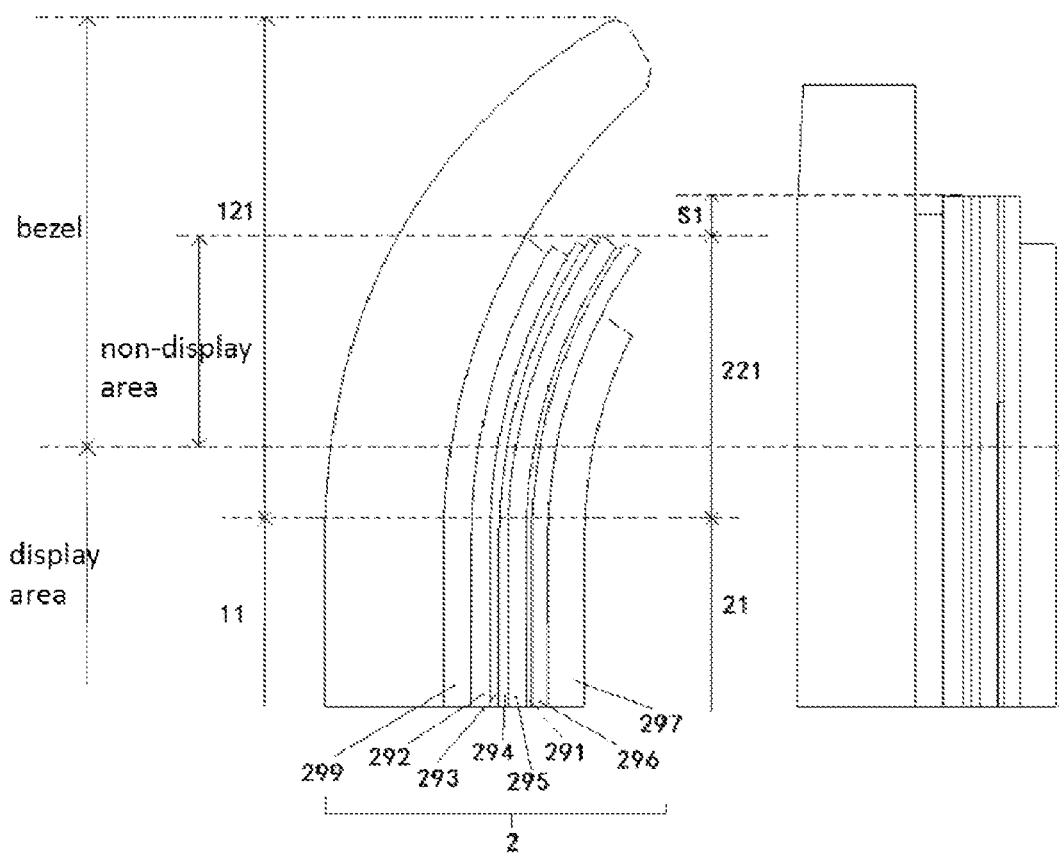
FIG. 4 is a schematic diagram showing a comparison between a M1N1 position in FIG. 1 and a cross section of a display device in related art.

It should be understood that the above non-display area cannot realize display, and referring to FIG. 4, in a case where absolute sizes of the display area and the non-display area are consistent, compared with a case where the edge area is a plane, in the embodiment of the present disclosure, the orthographic projection of the edge of the non-display area away from the middle part 21 on the reference plane will be "retracted" by a certain distance S1, that is, the width of the non-display area "seen" by the user from the light-emitting side will be reduced by S1, which is beneficial for further reducing the width of the bezel.

For example, referring to FIG. 3, at the first edge curved surface part 121 being smaller, the distance S1 may be 0.11 mm.

In some implementations, the middle part 21, the edge part 22, and the corner part 23 of the display panel 2 are all provided with touch structures therein.

That is to say, a touch structure is provided in the middle part 21 of the display panel 2, so that touch control can be realized; touch structures are further provided in the edge part 22 and the corner part 23 of the display panel, so that touch control can be achieved.

An area of the display device corresponding to the middle part 21 is a plane, and thus the touch control of the middle part 21 may be performed according to display content (for example, by clicking an icon being displayed), the touch control in the edge part 22 and the corner part 23 may be performed according to display content (e.g., clicking the icon being displayed), or may be directly corresponding to a predetermined operation, for example, by clicking different edge parts 22 and corner parts 23, different specific operations of adjusting sound volume, turning on or off the display device, and the like may be respectively implemented, no matter what contents are displayed in the edge part 22 and the corner part 23.

Specifically, the touch structure described above may have various forms.

For example, the touch structure may be located in the touch layer 294 described above, and in such case, the touch layer 294 should be located in all the middle part 21, the edge part 22, and the corner part 23 of the display panel 2.

Alternatively, the touch structure may be integrated in the display layer 291, that is, the touch structure should be provided in the display layer 291 of the middle part 21, the edge part 22 and the corner part 23.

In some implementations, a cross section perpendicular to the first side edge 111 is a first cross section, and a cross section perpendicular to the second side edge 112 is a second cross section;
  in the first cross sections at different positions along a length direction of the first side edge 111, the first edge curved surface parts 121 have a same shape;
  in the second cross sections at different positions along a length direction of the second side edge 112, the second edge curved surface parts 122 have a same shape.

Figure 6:
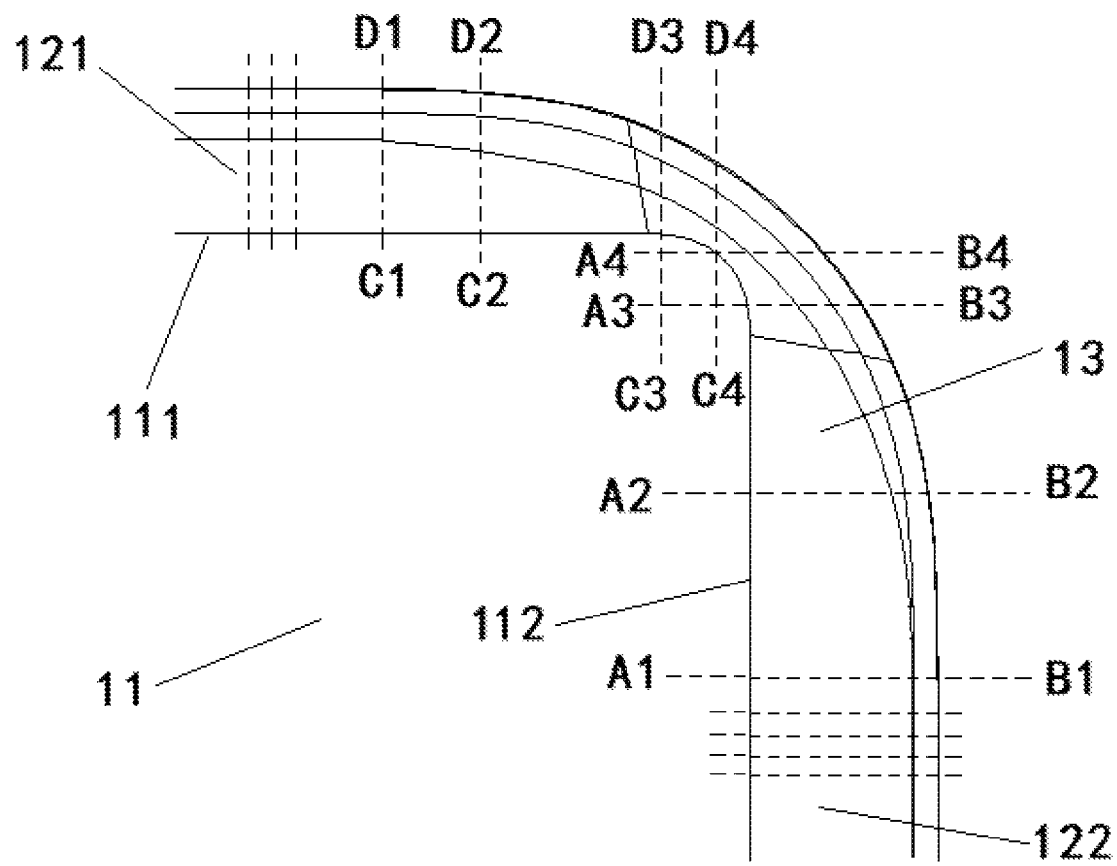
FIG. 6 is a schematic diagram illustrating a partially enlarged structure of a corner part of a display device according to an embodiment of the present disclosure.

Referring to FIG. 6, the first side edge 111 is an edge on a side of the middle plane part 11, which is a straight line (an extending direction thereof is the length direction thereof), and thus a cross section perpendicular to the straight line (the first side edge 111) is referred to as the first cross section, for example, each cross section passing through any one of lines C1D1, C2D2, C3D3, and C4D4 in FIG. 6, and perpendicular to the paper surface is the first cross section.

Similarly, the second side edge 112 is an edge on a side of the middle plane part 11, which is also a straight line (an extending direction thereof is the length direction thereof), and thus a cross section perpendicular to the straight line (the second side edge 112) is referred to as the second cross section, for example, each cross section passing through any one of lines A1B1, A2B2, A3B3 and A4B4 in FIG. 6, and perpendicular to the paper surface is the second cross section.

Referring to FIG. 6, at different positions of the first edge curved surface part 121 along the length direction of the first side edge 111 (e.g., at positions of unnumbered dashed lines intersecting the first edge curved surface part 121 in FIG. 6), different first cross sections may respectively cut the first edge curved surface part 121, and patterns of the first edge curved surface part 121 in the first cross sections should be the same.

Similarly, at different positions of the second edge curved surface part 122 along a length direction of the second side edge 112 (e.g., at positions of unnumbered dashed lines intersecting the second edge curved surface part 122 in FIG. 6), different second cross sections may respectively cut the second edge curved surface part 122, and patterns of the second edge curved surface part 122 in the second cross sections should be the same.

That is, each edge curved surface part 12 should have a same structure at different positions along the length direction of the side edge corresponding thereto.

In some implementations, an orthographic projection of the cover plate 1 on the reference plane is an arc-angle rectangle;
  an orthographic projection of the middle plane part 11 on the reference plane is an arc-angle rectangle;
  an orthographic projection of the display panel 2 on the reference surface is an arc-angle rectangle;
  an orthographic projection of the display area on the reference plane is an arc-angle rectangle.
The arc-angle rectangle is a shape similar to a rectangle. Specifically, similar to the rectangle, the arc-angle rectangle has four sides, the four sides are divided into two groups of sides, and sides of each group are opposite and parallel to each other, and the sides of different groups are perpendicular to each other; unlike the rectangle, the sides of different groups of the arc-angle rectangle are not coupled directly to form a right angle, but are coupled by a convex arc (arc corner), and thus the "arc-angle rectangle" is called.

Convex arc lines of corners of the arc-angle rectangular may be circular arc lines or other smooth arc lines.

Referring to FIG. 3, an orthographic projection of the cover plate 1 on the reference plane is an arc-angle rectangle; and an orthographic projection of the middle plane part 11 of the cover plate 1 on the reference plane is also an arc-angle rectangle. Thus, orthographic projections of the edge curved surface part 12 and the corner curved surface part 13 on the reference plane form an annular area between the two arc-angle rectangles.

Referring to FIG. 3, an orthographic projection of the display panel 2 on the reference plane is an arc-angle rectangle, and the arc-angle rectangle is located between the arc-angle rectangle of the orthographic projection of the cover plate 1 and the arc-angle rectangle of the orthographic projection of the middle plane part 11.

Referring to FIG. 3, an orthographic projection of the display area on the reference plane is also an arc-angle rectangle, and the arc-angle rectangle is located between the arc-angle rectangle of the orthographic projection of the display panel 2 and the arc-angle rectangle of the orthographic projection of the middle plane part 11.

In some implementations, from the first cross section at a boundary passing through the first edge part 221 and the corner part 23, for the first cross sections in a direction gradually away from the first edge part 221, an included angle between a surface of the corner part 23 at a position farthest from the middle part 21 and the reference plane gradually decreases from a first angle;
  from the second cross section at a boundary passing the second edge part 222 and the corner part 23, for the second cross sections in a direction gradually away from the second edge part 222, an included angle between the surface of the corner part 23 at a position farthest from the middle part 21 and the reference plane gradually decreases from a second angle.

Since the corner part 23 and the edge part 22 of the display panel 2 correspond to the curved surface part of the cover plate 1, the corner part 23 and the edge part 22 are inclined to a greater degree as they are farther from the middle part 21 (or "more and more outside"), and an inclination degree can represent a degree of curvature of the corner part 23 and the edge part 22 (and the corner curved surface part 13 and the edge curved surface part 12 corresponding thereto).

That is, for any cross section (including but not limited to the first cross section and the second cross section) perpendicular to the reference plane, an included angle between a surface (any side surface, since both side surfaces of the display panel 2 are parallel to each other) at the edge of the display panel 2 and the reference plane may represent a degree of bending of the cover plate 1 and the display panel 2 at the cross section.

Figure 7:
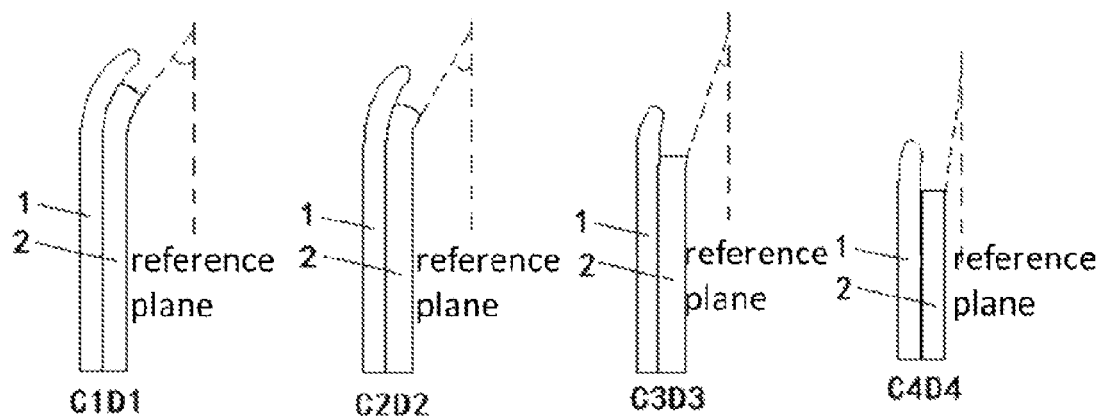
FIG. 7 is a cross sectional structural comparison diagram of first cross sections at positions C1D1, C2D2, C3D3, and C4D4 in FIG. 6.

Referring to FIGS. 6 and 7, for the first cross section (i.e., the first cross section passing through the line C1D1) passing through the boundary (i.e., the line C1D1) between the corner part 23 and the first edge part 221, an included angle between a surface (any side surface, since both side surfaces of the display panel 2 are parallel to each other) of the corner part 23 farthest from the middle part 21 and the reference plane is a first angle; and for first cross sections in a direction gradually away from the first edge part 221 (i.e., in a direction from the line C1D1 to the line C4D4), the included angle between the surface of the corner 23 farthest from the middle part 21 and the reference plane gradually decreases from the first angle until decreasing approximately to 0 degree.

Figure 8:
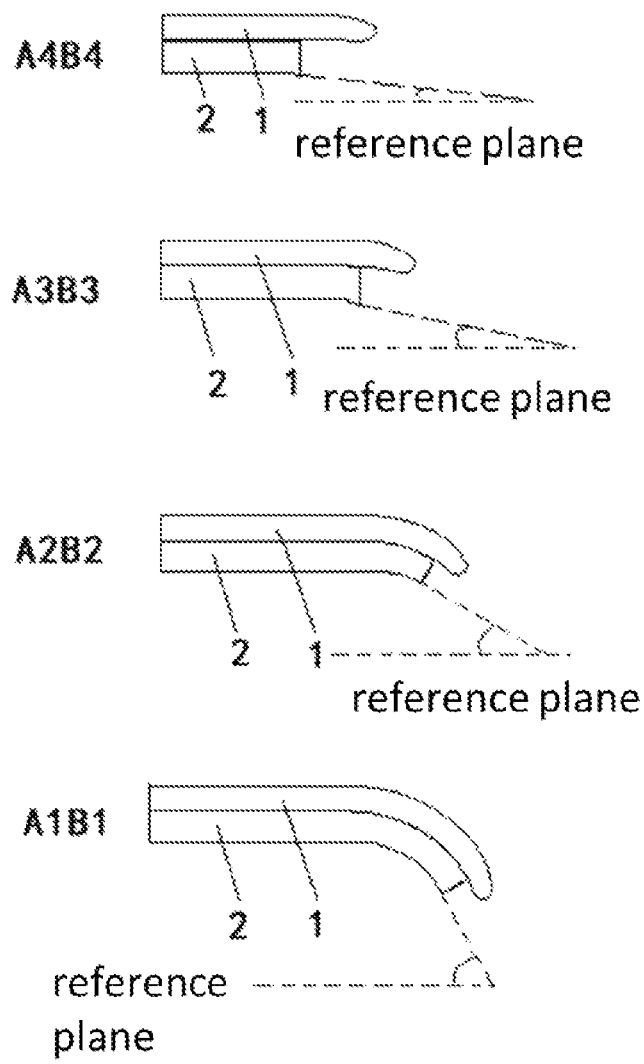
FIG. 8 is a cross sectional structural comparison diagram of second cross sections at positions A1B1, A2B2, A3B3 and A4B4 in FIG. 6.

Similarly, referring to FIGS. 6 and 8, for the second cross section (i.e., the second cross section passing through the line A1B1) passing through the boundary (i.e., the line A1B1) between the corner part 23 and the second edge part 222, an included angle between a surface (any side surface, since both side surfaces of the display panel 2 are parallel to each other) of the corner part 23 farthest from the middle part 21 and the reference plane is a second angle; and for second cross sections in a direction away from the second edge part 222 (i.e., in a direction from the line A1B1 to the line A4B4), the included angle between the surface of the corner part 23 furthest from the middle part 21 and the reference plane decreases from the second angle until decreasing approximately to 0 degree.

That is, each edge part 22 has only a component of bending in one direction, e.g., the first edge par 221 has only a component of bending in the first cross section, while the second edge part 222 has only a component of bending in the second cross section.

While the corner part 23 has a "component of bending" in two directions, as there is a component of bending in the first and second cross sections, it is equivalent that the corner part 23 is "mixed bent".

Moreover, at a position adjacent to the first edge part 22, the corner part 23 has the largest component of bending in the first cross section, and almost no component of bending in the second cross section; and the farther the corner part 23 is distant from the first edge part 221, the smaller the component of bending in the first cross section is.

Similarly, at a position adjacent to the second edge part 222, the corner part 23 has the largest component of bending in the second cross section and almost no component of bending in the first cross section, the farther the corner part 23 is distant from the second edge part 222, the smaller the component of bending in the second cross section is.

As seen from above, the corner 23 achieves a "uniform transition" of bending in the first edge part 221 and second edge part 222.

In some implementations, the first angle is between 30 degrees and 60 degrees; the second angle is between 50 degrees and 75 degrees; the first angle is less than the second angle.

Specifically, referring to FIGS. 7 and 8, the first angle may be between 30 degrees and 60 degrees, further between 40 degrees and 55 degrees, and further may be 51 degrees; the second angle may be between 50 degrees and 75 degrees, further between 60 degrees and 72 degrees, and further may be 70 degrees.

That is, the maximum bending degree of the display panel 2 in the first cross section perpendicular to the first side edge 111 (short edge) is smaller than the maximum bending degree of the display panel 2 in the second cross section perpendicular to the second side edge 112 (long edge), that is, the bending degree at the long edge (second side edge 112) of the display panel 2 is larger.

In some implementations, in the reference plane, an orthographic projection of an edge of each corner part 23 away from the middle part 21 is a convex arc shape having two end points, where the end point coupled to the orthographic projection of the first edge part 221 is a first end point, and the end point coupled to the orthographic projection of the second edge part 222 is a second end point;

the line passing through the first end point and being parallel to the orthographic projection of the second side edge 112 and the line passing through the second end point and being parallel to the orthographic projection of the first side edge 111 have an intersection point and form an included angle, the intersection point is a positioning point of the corner part 23, and the included angle is a positioning angle of the corner part 23;

for any point on the convex arc shape, the cross section which passes through the point and the positioning point and is vertical to the reference surface is a third cross section at the point, and in the third cross section, an included angle between the surface of the corner part 23 farthest away from the middle part 21 and the reference surface is a comprehensive included angle at the point;

in a direction from the first end point to the second end point, the comprehensive included angle corresponding to each point on the convex arc shape gradually deceases from the first angle to a third angle and then gradually increases to the second angle.

Figure 9:
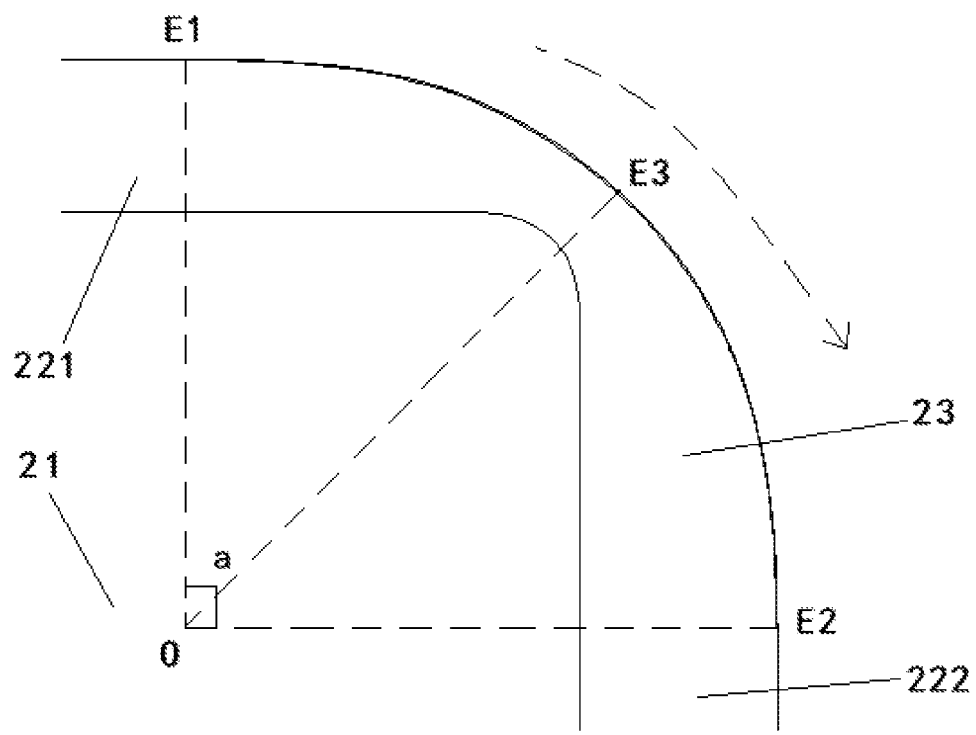
FIG. 9 is a schematic diagram of a partial structure at a corner of a display device according to an embodiment of the present disclosure.

Referring to FIG. 9, since the orthographic projection of the display panel 2 on the reference plane is an arc-angle rectangle, the orthographic projection of the edge of the corner part 23 away from the middle part 21 on the reference plane is necessarily a convex arc shape having two end points, namely, a second end point E2 coupled to the second edge part 222 and a first end point E1 coupled to the first edge part 221, and a line E2O parallel to the first side edge 111 and a line E1O parallel to the second side edge 112 are made from the second end point E2 and the first end point E1, respectively, so that the two lines are necessarily intersected at a point O to form an included angle a, the point O is a positioning point of the corner part 23, and the included angle a is a positioning angle of the corner part 23.

It should be appreciated that since the first side edge 111 and the second side edge 112 are perpendicular to each other, the above positioning angle is a right angle.

Referring to FIG. 9, there is a coupling line (e.g., line E1O, E2O, E3O) between any point (e.g., points E1, E2, E3) on the convex arc shape of the edge of the corner part 23 and the positioning point O, and a cross section passing through the coupling line and perpendicular to the reference plane is the third cross section at the point (e.g., cross sections passing through the lines E1O, E2O, E3O respectively and perpendicular to the paper plane).

It is clear that for the third cross section at each point of the convex arc shape of the edge of the corner part 23, an included angle is formed between the surface of the corner part 23 farthest from the middle part 21 (either side surface, since both side surfaces of the display panel 2 are parallel to each other) and the reference plane, which is called a comprehensive angle b at the point, and it can be seen that comprehensive angles b at different points on the convex arc shape of the edge of the corner part 23 are different.

Figure 10:
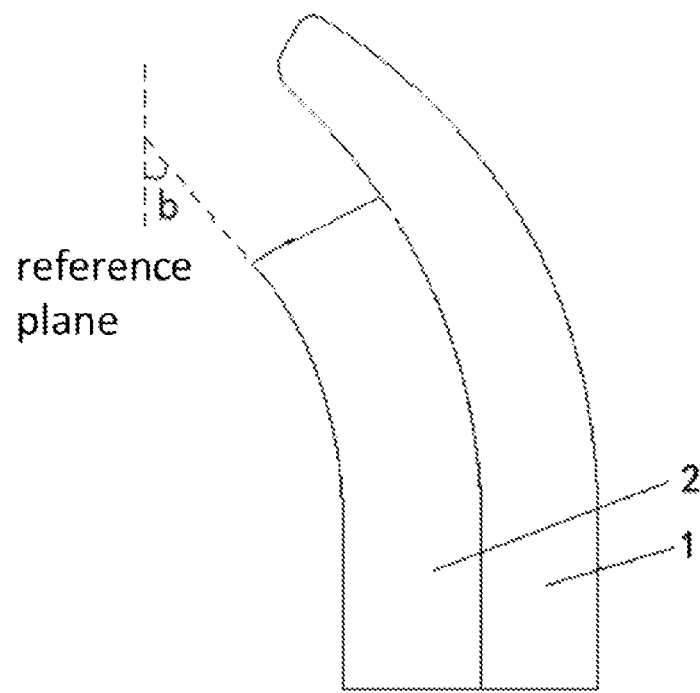
FIG. 10 is a cross sectional structural diagram of a third cross section corresponding to a position OE1 in FIG. 9.
Figure 11:
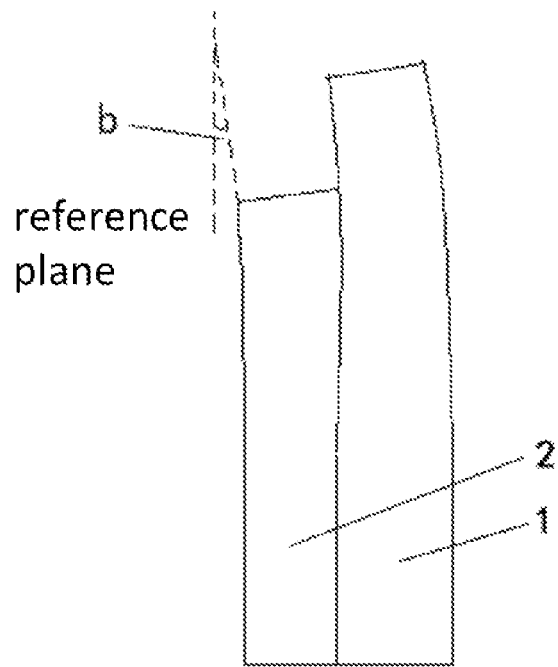
FIG. 11 is a cross sectional structural diagram of a third cross section corresponding to a position OE3 in FIG. 9.
Figure 12:
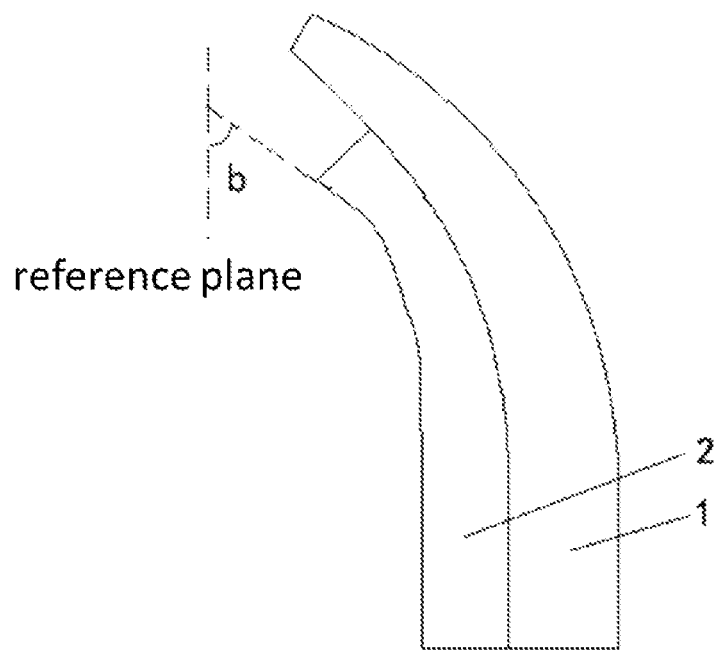
FIG. 12 is a cross sectional structural diagram of a third cross section corresponding to a position OE2 in FIG. 9.

Referring to FIGS. 10 to 12, in a direction from the first end point E1 to the second end point E2 (i.e., an arrow direction of an arc from E1 to E3 to E2), the comprehensive included angle corresponding to each point on the convex arc shape gradually decreases from a first angle (e.g. an angle between 30 degrees and 60 degrees) to a third angle, and gradually increases from the third angle to a second angle (e.g. an angle between 50 degrees and 75 degrees).

Referring to FIGS. 10 to 12, the "comprehensive included angle" described above represents an "overall degree of bending" at each position of the corner part 23 being "mixed bent". That is, the overall degree of bending of the corner part 23 is greater on both sides thereof coupled to the edge part 22 and relatively smaller in the middle thereof.

The display device is generally obtained by attaching the flexible, flat display panel 2 to the cover plate 1 (described in detail later). In the attaching process, the corner part 23 and the edge part 22 of the display panel 2 being flat need to be deformed and bent into a curved surface shape matching the corner curved surface part 13 and the edge curved surface part 12. As described above, the display panel 2 is bent in only one direction at each edge part 22, and the deformation thereof is relatively easy to be achieved; and the corner part 23 actually has two "components of bending" in different directions, which is "mixed bent", but it is difficult to simultaneously realize bending in different directions of the display panel 2 being flat, and defects such as Crack and circuit damage (e.g., GDS) easily occur.

In view of above, the corner part 23 may be designed to have a small bending degree at the middle thereof and a large bending degree at two sides thereof, so as to achieve uniform transition of components of bending in different directions in the corner part 23, and an occurrence of defects is avoided.

In some implementations, a coupling line between a point on the convex arc shape, with the comprehensive included angle being equal to the third included angle, and the positioning point is an angle bisector of the positioning angle.

Referring to FIGS. 9 and 11, from a uniform perspective, the point on the convex arc shape corresponding to the smallest comprehensive included angle should lie on the angle bisector of the positioning angle, for example, may be the point E3 mentioned above.

In some implementations, the third angle is between 1 degree and 5 degrees.

Specifically, the minimum value (third angle) of the comprehensive included angle mentioned above may be between 1 degree and 5 degrees, for example, may be 3 degrees. That is, the third angle may be so small that the corner part 23 is approximately flat at a corresponding position and is bent very lightly.

In some implementations, the display device further includes:
a binding part 41 provided on a side of the display panel 2 away from the cover plate 1;
a bending part 42 coupled between the binding part 41 and an edge of the display panel 2 corresponding to the first edge curved surface part 121 having the larger width;
a bending spacer 3 provided between the display panel 2 and the binding part 41, and having a first surface 31 bonded to the display panel 2 and a second surface 32 bonded to the binding part 41;
the second surface 32 includes a convex arc area 321 and a plane area 322 which are contiguous;
an orthographic projection of the plane area 322 on the reference plane is positioned in an orthographic projection of the middle plane part 11 on the reference plane;
an orthogonal projection of the convex arc area 321 on the reference plane is partially located in the orthogonal projection of the middle plane part 11 on the reference plane, and partially located in an orthogonal projection of the first edge curved edge part 121 having the larger width on the reference plane.

Figure 5:
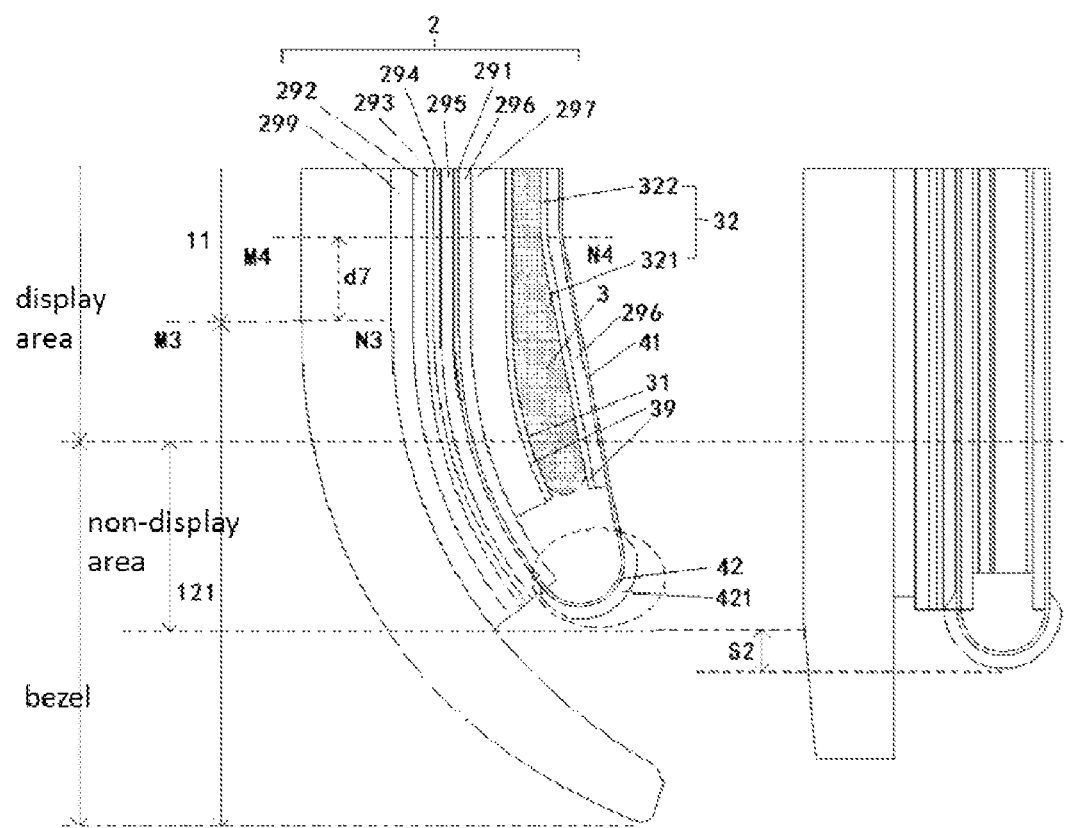
FIG. 5 is a schematic diagram showing a comparison between a M2N2 position in FIG. 1 and a cross section of a display device in related art.

Referring to FIG. 5, a display driving signal is obtained, the display panel 2 further needs to be coupled to the binding part 41, and the binding part 41 is used for bonding a driving chip (Driver IC) and the like. The binding part 41 is coupled to the display panel 2 through the bending part 42, and the binding part 41 may be bent to a side (back side) of the display panel 2 away from the cover plate 1 by bending the bending part 42, so as to narrow the bezel as much as possible.

In the embodiment of the present disclosure, the binding portion 41 and the bending part 42 are provided at positions corresponding to the first edge curved surface part 121 having the larger width.

The bending part 42 and the binding part 41 may be independent structures coupled to the display panel 2, for example, the bending part 42 and the binding part 41 may be Flexible Printed Circuit (FPC) coupled to the display panel 2.

Alternatively, the bending part 42 and the binding part 41 may be integrated with a portion of layer structures in the display panel 2.

For example, referring to FIG. 5, both the bending part 42 and the binding part 41 may be integrated with the display layer 291 of the display panel 2, that is, the display layer 291 extends beyond the display panel 2 to form the bending part 42, and then extends to form the binding part 41; a protective adhesive layer 421 may be additionally attached to the bending part 42, and a back film layer 296 may be disposed on the binding part 41 for protection.

In addition, when the touch layer 294 is provided, the touch layer 294 may be coupled to a corresponding touch flexible circuit board to realize driving in touch process, and the touch flexible circuit board may also be coupled to the side (back side) of the display panel 2 away from the cover plate 1.

Referring to FIG. 5, in a case where absolute sizes of the display area and the non-display area are consistent, compared with a case where the edge area is a plane, in the embodiment of the present disclosure, an orthographic projection of the edge of the non-display area away from the middle part 21 on the reference plane may be "retracted" by a certain distance S2, that is, a width of the non-display area that can be "seen" by the user from the light-emitting side may be reduced by S2, which is beneficial to further reducing the width of the bezel.

In addition, since the width of the first edge curved surface portion 121 is larger, the distance S2 retracted is also larger, for example, may be 0.353 mm, so that the bezel can be more effectively narrowed.

Referring to FIG. 5, a bending spacer 3 may be further provided between the binding part 41 and the display panel 2, the bending spacer 3 may be made of a relatively flexible material such as foam, and both side surfaces (the first surface 31 and the second surface 32) thereof are respectively bonded to the display panel 2 and the binding part 41, for example, by a double-sided adhesive 39.

Referring to FIG. 5, the binding part 41 is finally attached to be flat, but since the first edge curved surface part 121 in the embodiment of the present disclosure is a curved surface, if the second surface 32 of the bending spacer 3 is completely flat, a position where the binding part 41 starts to be bonded to the second surface 32 of the bending spacer 3 is easily damaged due to a sharp bending. Therefore, the second surface 32 of the bending spacer 3 includes the convex arc area 321 and the plane area 322 coupled to each other, and the convex arc area 321 is closer to (lower than) the first edge curved surface part 121 being larger, so that the binding part 41 is firstly bonded on an arc surface (the convex arc area 321) matching with the shape thereof naturally formed, and then gradually transits to a plane structure (the plane area 322), so as to realize a relatively uniform transition and avoid to be damaged.

Referring to FIG. 5, since the first surface 31 of the bending spacer 3 is adhered to the display panel 2, the surface thereof naturally matches the surface of the display panel 2, i.e., matches the shape of the cover plate 1, that is, a portion of the first surface 31 is a convex arc surface. Thus, a lower portion of the bending spacer 3 has a shape like a "drop shape" in a cross section perpendicular to the reference plane.

In some implementations, a curvature radius of the bending part 42 is equal to a limit curvature radius, which is the minimum curvature radius that the bending part 42 can achieve by being bent without being damaged; a distance between an orthogonal projection of the edge of the convex arc area 321 coupled to the plane area 322 on the reference plane and an orthogonal projection of the first side edge 111 adjacent to the first edge curved edge part 121 with the larger width on the reference plane is between 1.5 mm and 2.5 mm.

Referring to FIG. 5, in order to minimize the bezel, the bending part 42 should also be bent to the largest extent possible without being damaged to reach the smallest curvature radius, i.e., the limit curvature radius, which may be less than 1 mm, for example, may be 0.3 mm.

Meanwhile, in order to achieve more and more uniform transition and avoid risks, the convex arc area 321 should have a relative large size. Referring to FIG. 5, the line M3N3 corresponds to the first side edge 111 of the middle plane part 11, and the line M4N4 corresponds to the edge of the convex arc area 321, a distance d7 between these two lines should be between 1.5 mm and 2.5 mm, for example, may be 2 mm. That is, in the reference plane, the orthogonal projection of the convex arc area 321 should "enter" the orthogonal projection of the middle plane part 11, and the distance d7 entered is between 1.5 mm and 2.5 mm.

Further, a specific shape of the convex arc surface 321 may be configured according to a position of boundary of the convex arc surface 321, so as to ensure that the binding part 41 is not damaged due to excessive bending.

In a second aspect, an embodiment of the present disclosure provides a method for manufacturing the display device described above, and the method includes following steps S101 and S102.

At S101, the flat, flexible display panel 2 is placed between the mold 6 and the cover plate 1.

Figure 15:
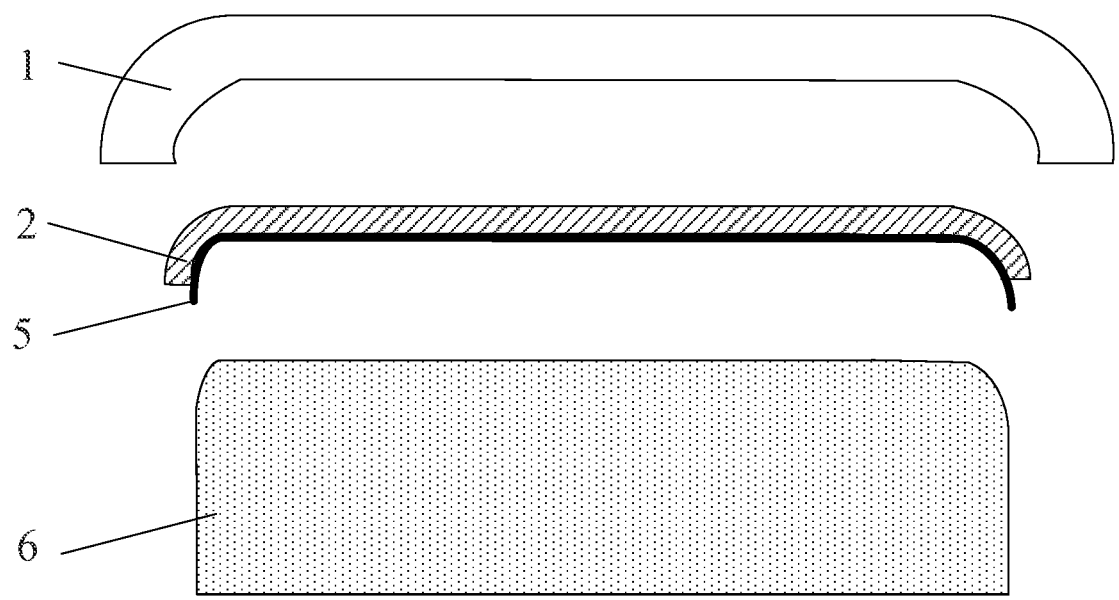
FIG. 15 is a schematic diagram of a structure before being extruded in a method for manufacturing a display device according to an embodiment of the present disclosure.

It is difficult to directly prepare the display panel 2 having a desired curved shape, and therefore, referring to FIG. 15, the display panel 2 having a flat surface and the cover plate 1 having a desired shape are generally obtained in the embodiment of the present disclosure, and then the display panel 2 is placed between the mold 6 (Pad) and the cover plate 1.

The mold 6 may be made of a material with certain deformability, such as silicone, and a shape of a side of the mold 6 facing the cover plate 1 substantially matches a shape of the cover plate 1.

The display panel 2 is flexible and thus deformable. Specifically, the display panel 2 may be obtained by cutting a large-sized motherboard by laser or the like.

The cover plate 1 is a rigid plate made of glass or the like, and has a desired shape. In particular, the cover plate 1 can be obtained by hot-bending a flat glass plate with an equal-thickness.

However, referring to FIGS. 4 and 5, in a hot-bending process, a thickness of the edge of the cover plate 1 may be reduced to some extent due to the process, and will not be described in detail.

At S102, the mold 6 and the cover plate 1 are made relatively close to extrude the display panel 2, so that the display panel 2 is formed into a shape matched with the cover plate 1.

Figure 16:
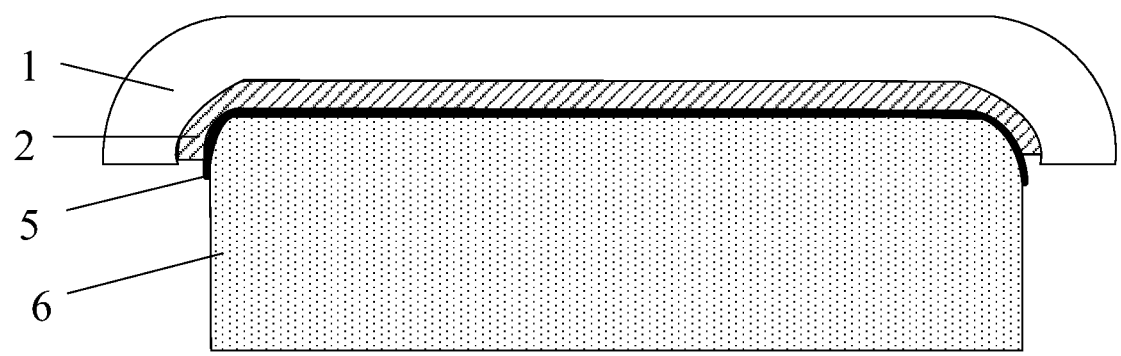
FIG. 16 is a schematic diagram of a structure being extruded in a method for manufacturing a display device according to an embodiment of the present disclosure.
Figure 17:
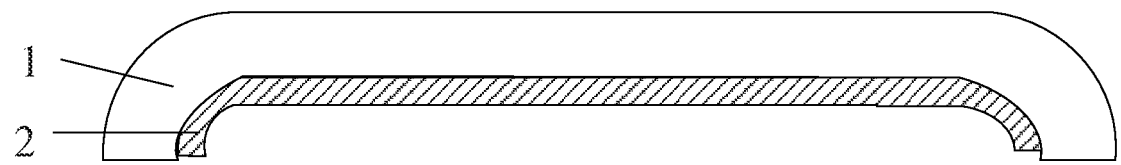
FIG. 17 is a schematic diagram of a structure after a carrier film is separated according to an embodiment of the present disclosure.

Referring to FIG. 16, the mold 6 may be pressed against the cover plate 1, so that the display panel 2 is extruded and attached to the cover plate 1 by the mold 6, and is formed in a shape adapted to the cover plate 1; at this time, the mold 6 is removed, and the display device of the embodiment of the present disclosure with reference to FIG. 17 is obtained.

In some implementations, before placing the flat, flexible display panel 2 between the mold 6 and the cover plate 1 (S101), the method further includes:

S100, attaching the flat, flexible display panel 2 to a flexible carrier film 5, so as to pre-deform the carrier film 5 and the display panel 2 thereon.

After making the mold and the cover plate 1 relatively close to extrude the display panel 2 (S102), the method further includes:

S103, separating the carrier film 5 from the display panel 2.

Figure 13:
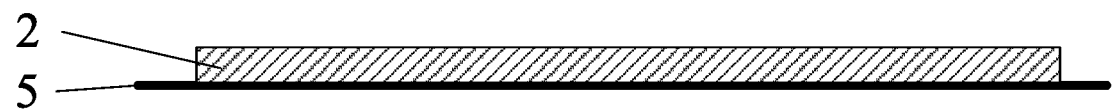
FIG. 13 is a schematic structural diagram illustrating a display panel and a carrier film bonded together in a method for manufacturing a display device according to an embodiment of the present disclosure.
Figure 14:
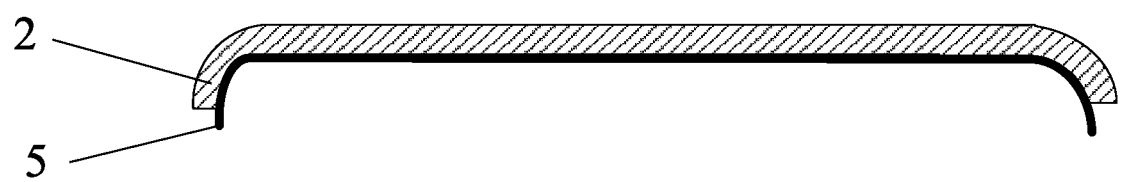
FIG. 14 is a schematic diagram of a structure, in which a display panel and a carrier film are pre-deformed, in a method for manufacturing a display device according to an embodiment of the present disclosure.

In order to facilitate a deformation of the display panel 2, referring to FIG. 13, the display panel 2 and the carrier film 5 being flexible but strong may be first bonded together by optical glue; then, referring to FIG. 14, the carrier film 5 is bent into a shape substantially matching the cover plate 1 (since the carrier film 5 has a certain strength, the carrier film 5 can substantially maintain a desired shape), and the display panel 2 on the carrier film 5 is accordingly bent into the desired shape, thereby completing a pre-deformation of the carrier film 5 and the display panel 2.

Thereafter, referring to FIG. 15, the carrier film 5 may be placed between the mold 6 and the cover plate 1 together with the display panel 2 (the carrier film 5 is located on a side of the display panel 2 proximal to the cover plate 1) to be extruded.

After the extrusion is completed, referring to FIG. 16, the carrier film 5 is separated from the display panel 2 by ultraviolet irradiation, and the display device of the embodiment of the present disclosure is obtained.

The present disclosure has disclosed example embodiments, and although specific terms are employed, they are used and should be interpreted in a generic and descriptive sense only and not for purposes of limitation. In some instances, features, characteristics and/or elements described in junction with a particular embodiment may be used alone or in combination with features, characteristics and/or elements described in junction with other embodiments, unless expressly stated otherwise, as would be apparent to one skilled in the art. It will, therefore, be understood by those skilled in the art that various changes in form and details may be made therein without departing from the scope of the present disclosure as set forth in the appended claims.

The invention claimed is:

1. A display device, comprising a cover plate and a display panel,
    the display panel is arranged on the cover plate, and a shape of the display panel is matched with that of the cover plate;
    the cover plate comprises a middle plane part, an edge curved surface part and a corner curved surface part;
    the middle plane part is provided with two first side edges opposite to each other, two second side edges opposite to each other and four corners positioned between the first side edges and the second side edges;

the edge curved surface part comprises two first edge curved surface parts and two second edge curved surface parts; the two first edge curved surface parts are respectively adjacent to the two first side edges, and the two second edge curved surface parts are respectively adjacent to the two second side edges;

shapes of the two first edge curved surface parts are different; and shapes of the two second edge curved surface parts are the same;

a surface parallel to a surface of the middle plane part is a reference surface; a distance between orthographic projections of an edge adjacent to the middle plane part and an edge away from the middle plane part of each edge curved surface part on the reference surface is a width of the edge curved surface part;

widths of the two first edge curved surface parts are different, and a ratio of a smaller width to a larger width is between 0.65 and 0.85;

the corner curved surface part is adjacent to a corner of the middle plane part and is positioned between the first edge curved surface part and the second edge curved surface part;

the display panel comprises a middle part, an edge part and a corner part; the middle part is arranged correspondingly to the middle plane part; the edge part comprise a first edge part and a second edge part; the first edge part and the first edge curved surface part are arranged correspondingly, and the second edge part and the second edge curved surface part are arranged correspondingly; the corner part and the corner curved surface part are correspondingly arranged;

the display panel comprises a display area; the middle part is the display area; at least a portion of the edge part and the corner part adjacent to the middle part is the display area, wherein an orthographic projection of the cover plate on the reference surface is an arc-angle rectangle;

an orthographic projection of the middle plane part on the reference surface is an arc-angle rectangle;

an orthographic projection of the display panel on the reference surface is an arc-angle rectangle;

an orthographic projection of the display area on the reference surface is an arc-rectangle, a cross section perpendicular to the first side edge is a first cross section, and a cross section perpendicular to the second side edge is a second cross section;

from the first cross section passing through the boundary between the first edge part and the corner part for first cross section along a direction gradually away from the first edge part, an included angle between a surface of the corner part farthest away from the middle part and the reference surface gradually decreases from a first angle;

from the second cross section passing through a boundary between the second edge part and the corner part, for second cross sections along a direction gradually away from the second edge part, an included angle between the surface of the corner part farthest from the middle part and the reference surface gradually decreases from a second angle.

2. The display device according to claim 1, wherein a distance between orthographic projections of edges of the two first edge curved surface parts away from the middle plane part on the reference surface is between 150 mm and 170 mm;

a distance between orthographic projections of edges of the two second edge curved surface parts away from the middle plane part on the reference surface is between 65 mm and 80 mm.

3. The display device according to claim 2, wherein a distance between the two first side edges is between 140 mm and 160 mm;

a distance between the two second side edges is between 60 mm and 70 mm.

4. The display device according to claim 2, wherein widths of the two first edge curved surface parts are respectively between 2 mm and 4 mm and between 3 mm and 6 mm;

a width of the second edge curved surface part is between 3 mm and 4 mm.

5. The display device according to claim 4, wherein for each edge part, a distance between an orthographic projection of an edge of the display area and an orthographic projection of an edge of the edge part adjacent to the middle part on the reference surface is a display width of the edge part;

display widths of the two first edge parts are different and are respectively between 0.5 mm and 1 mm and between 0.3 mm and 0.8 mm;

display widths of the two second edge parts are the same and each range from 1.5 mm to 2.5 mm.

6. The display device according to claim 1, wherein in the reference surface, an orthographic projection of an edge of each corner part away from the middle part is a convex arc having two end points, wherein the end point coupled to an orthographic projection of the first edge part is a first end point, and the end point coupled to an orthographic projection of the second edge part is a second end point;

a line passing through the first end point and parallel to the orthographic projection of the second side edge and a line passing through the second end point and parallel to the orthographic projection of the first side edge have an intersection point and form an included angle, the intersection point is a positioning point of the corner part, and the included angle is a positioning angle of the corner part;

for any point on the convex arc, a cross section passing through the point and the positioning point and vertical to the reference surface is a third cross section at the point, and in the third cross section, an included angle between a surface of the corner part farthest away from the middle part and the reference surface is a comprehensive included angle at the point;

in a direction from the first end point to the second end point, the comprehensive included angle corresponding to each point on the convex arc gradually decreases from the first angle to a third angle and then gradually increases to the second angle.

7. The display device according to claim 6, wherein a coupling line between a point on the convex arc with the comprehensive included angle being the third angle and the positioning point is an angle bisector of the positioning angle.

8. The display device according to claim 6, wherein the third angle is between 1 degree and 5 degrees.

9. The display device according to claim 8, wherein a curvature radius of the bending part is equal to a limit curvature radius which is the minimum curvature radius that the bending part is capable of achieving by being bent without being damaged;

a distance between an orthographic projection of an edge of the convex arc surface area coupled to the plane area on the reference surface and an orthographic projection of the first side edge adjacent to the first edge curved surface part with the larger width on the reference surface is between 1.5 mm and 2.5 mm.

10. A method for manufacturing the display device according to claim 1, the method comprising:
disposing a flat, flexible display panel between a mold and a cover plate;
making the mold and the cover plate relatively close to extrude the display panel, so that the display panel forms a shape matched with the cover plate.

11. The method according to claim 10, further comprising:
before the disposing the flat, flexible display panel between the mold and the cover plate, attaching the flat, flexible display panel to a flexible carrier film and pre-deforming the carrier film and the display panel thereon;
after making the mold and the cover plate relatively close to extrude the display panel, separating the carrier film from the display panel.

12. The display device according to claim 1, wherein the edge part and the corner part each have a non-display area located on a side of the display area away from the middle part.

13. The display device according to claim 1, wherein touch structures are arranged in the middle part, the edge part and the corner part of the display panel.

14. The display device according to claim 1, wherein a cross section perpendicular to the first side edge is a first cross section, and a cross section perpendicular to the second side edge is a second section;
shapes of the first edge curved surface part in first cross sections at different positions along a length direction of the first side edge are the same;
shapes of the second edge curved surface part in second cross sections at different positions along a length direction of the second side edge are the same.

15. The display device according to claim 1, wherein the first angle is between 30 degrees and 60 degrees;
the second angle is between 50 degrees and 75 degrees;
the first angle is less than the second angle.

16. The display device according to claim 1, further comprising:
a binding part arranged on a side, away from the cover plate, of the display panel;
a bending part coupled between the binding part and an edge of the display panel corresponding to the first edge curved surface part with the larger width;
a bending spacer provided between the display panel and the binding part, and having a first surface bonded to the display panel and a second surface bonded to the binding part;
the second surface comprises a convex arc surface area and a plane area which are coupled;
an orthographic projection of the plane area on the reference surface is positioned in an orthographic projection of the middle plane part on the reference surface;
a portion of orthographic projection of the convex arc surface area on the reference surface is positioned in the orthographic projection of the middle plane part on the reference surface, and another portion of orthographic projection of the convex arc surface area is positioned in an orthographic projection of the first edge curved surface part with the larger width on the reference surface.

17. A display device, comprising a cover plate and a display panel, the display panel is arranged on the cover plate, and a shape of the display panel is matched with that of the cover plate;
the cover plate comprises a middle plane part, an edge curved surface part and a corner curved surface part;
the middle plane part is provided with two first side edges opposite to each other, two second side edges opposite to each other and four corners positioned between the first side edges and the second side edges;
the edge curved surface part comprises two first edge curved surface parts and two second edge curved surface parts; the two first edge curved surface parts are respectively adjacent to the two first side edges, and the two second edge curved surface parts are respectively adjacent to the two second side edges;
shapes of the two first edge curved surface parts are different; and shapes of the two second edge curved surface parts are the same;
a surface parallel to a surface of the middle plane part is a reference surface; a distance between orthographic projections of an edge adjacent to the middle plane part and an edge away from the middle plane part of each edge curved surface part on the reference surface is a width of the edge curved surface part;
widths of the two first edge curved surface parts are different, and a ratio of a smaller width to a larger width is between 0.65 and 0.85;
the corner curved surface part is adjacent to a corner of the middle plane part and is positioned between the first edge curved surface part and the second edge curved surface part;
the display panel comprises a middle part, an edge part and a corner part; the middle part is arranged correspondingly to the middle plane part; the edge part comprise a first edge part and a second edge part; the first edge part and the first edge curved surface part are arranged correspondingly, and the second edge part and the second edge curved surface part are arranged correspondingly; the corner part and the corner curved surface part are correspondingly arranged;
the display panel comprises a display area; the middle part is the display area; at least a portion of the edge part and the corner part adjacent to the middle part is the display area,
wherein the display device further comprises:
a binding part arranged on a side, away from the cover plate, of the display panel;
a bending part coupled between the binding part and an edge of the display panel corresponding to the first edge curved surface part with the larger width;
a bending spacer provided between the display panel and the binding part, and having a first surface bonded to the display panel and a second surface bonded to the binding part;
the second surface comprises a convex arc surface area and a plane area which are coupled;
an orthographic projection of the plane area on the reference surface is positioned in an orthographic projection of the middle plane part on the reference surface;
a portion of orthographic projection of the convex arc surface area on the reference surface is positioned in the orthographic projection of the middle plane part on the reference surface, and another portion of orthographic projection of the convex arc surface area is positioned in an orthographic projection of the first edge curved surface part with the larger width on the reference surface.

\* \* \* \* \*